(12) United States Patent
Karnes

(10) Patent No.: US 10,802,052 B2
(45) Date of Patent: Oct. 13, 2020

(54) CIRCUIT MULTI-TESTER INCLUDING PHASE ROTATION-MEASUREMENT CIRCUITRY

(71) Applicant: Branch Banking and Trust Company, Winston-Salem, NC (US)

(72) Inventor: William Henry Karnes, Mount Holly, NC (US)

(73) Assignee: Truist Bank, Charlotte, NC (US)

( * ) Notice: Subject to any disclaimer, the term of this patent is extended or adjusted under 35 U.S.C. 154(b) by 51 days.

(21) Appl. No.: 16/109,907

(22) Filed: Aug. 23, 2018

(65) Prior Publication Data
US 2020/0064377 A1  Feb. 27, 2020

(51) Int. Cl.
| | | |
|---|---|---|
| *G01R 15/12* | (2006.01) |
| *G01R 29/18* | (2006.01) |
| *G01R 19/155* | (2006.01) |
| *G01R 19/14* | (2006.01) |
| *G01R 25/00* | (2006.01) |
| *H01B 1/02* | (2006.01) |
| *H04B 1/02* | (2006.01) |

(52) U.S. Cl.
CPC ............. *G01R 15/12* (2013.01); *G01R 19/14* (2013.01); *G01R 19/155* (2013.01); *G01R 29/18* (2013.01); *G01R 25/00* (2013.01); *H04B 1/02* (2013.01)

(58) Field of Classification Search
CPC ......... G01R 19/14; G01R 19/18; G01R 31/42
See application file for complete search history.

(56) References Cited

U.S. PATENT DOCUMENTS

| | | | | |
|---|---|---|---|---|
| 7,057,401 B2* | 6/2006 | Blades | .................. | G01R 31/02 |
| | | | | 324/424 |
| 2009/0212964 A1* | 8/2009 | Hibma | ............. | G01R 19/16547 |
| | | | | 340/657 |

* cited by examiner

*Primary Examiner* — Noam Reisner
(74) *Attorney, Agent, or Firm* — Kilpatrick Townsend & Stockton LLP

(57) ABSTRACT

Systems and methods can be used in connection with a circuit multi-tester including phase rotation-measurement circuitry. A power-testing device comprising a plug and an enclosure with circuitry can be used to display various power characteristics of a receptacle. The plug of the power-testing device can be received into a compatible power receptacle. The reception of the plug into the receptacle can allow for power communication from a power source supplying power to the power receptacle and the power-testing device for power measurement purposes. The power-testing device can include an enclosure with circuitry that can measure phase rotation information and can detect the presence of power on power lines of the receptacle. Based on the detected presence of power and phase rotation information, the power-testing device can output a visual indicator to the technician that represents the presence of the power and phase rotation orientation.

19 Claims, 5 Drawing Sheets

CIRCUIT MULTI-TESTER INCLUDING PHASE ROTATION-MEASUREMENT CIRCUITRY

TECHNICAL FIELD

The present disclosure relates to devices usable in connection with power measurement and testing. More specifically, this disclosure relates to a circuit multi-tester including phase rotation-measurement circuitry.

BACKGROUND

Power measurements can be performed prior to and during installation of electronic equipment or when diagnosing existing electrical systems. A receptacle from which an electronic device or system is to receive power can be analyzed to determine various electrical characteristics of a power source for the receptacle, including phase rotation, voltage level, and circuit breaker location. Failing to determine these electrical characteristics prior to installation or application of power may cause damage to the connected electrical system. For example, incorrect phase rotation may damage systems not designed for both clockwise and counterclockwise phase rotation configurations, or higher than anticipated voltage levels may damage circuitry designed for a specific range of voltages. Additionally, incorrectly identifying the power source corresponding to the analyzed receptacle can cause a technician to toggle power of other existing systems accidentally, therefore interrupting operations unnecessarily.

To ensure power characteristics are suitable for use in powering a system, a technician can use a phase rotation tester, a voltmeter, a circuit tracer, or other electrical measurement equipment to determine the electrical characteristics of the receptacle. This can be a dangerous and time-consuming process involving swapping out each device continuously to determine the next electrical characteristic. In addition, when swapping electrical measurement equipment, a technician can be at an increased risk of harm when manually probing the receptacle lines.

BRIEF SUMMARY

In one example, a power-testing device can comprise a plug that is configured to be received into a power receptacle for testing. The power-testing device can further comprise an enclosure with circuitry for outputting a visual indicator of a presence of power, per phase, for the power receptacle and of phase rotation information about the power receptacle.

In another example, a system comprises a plug, an enclosure with circuitry, a cord, and a circuit tracer device. The plug is configured to be received into a power receptacle for testing. The enclosure with circuitry can output a visual indicator of a presence of power, per phase, for the power receptacle and of phase rotation information about the power receptacle. The cord can be used to electrically couple the plug to the enclosure. The circuit tracer device can be communicatively couplable with the circuitry, wherein the circuit tracer device can be configured to receive power information from the circuitry for determining a location of a power source corresponding to the power receptacle.

In another example, a method comprises inserting a plug of a power-testing device into a power receptacle, and determining, by circuitry of the power-testing device, a presence of power, per phase, and phase rotation information about the power receptacle. The method further comprises outputting, by the circuitry of the power-testing device, a visual indicator based on the presence of power and phase rotation information.

DETAILED DESCRIPTION

Figure 1:
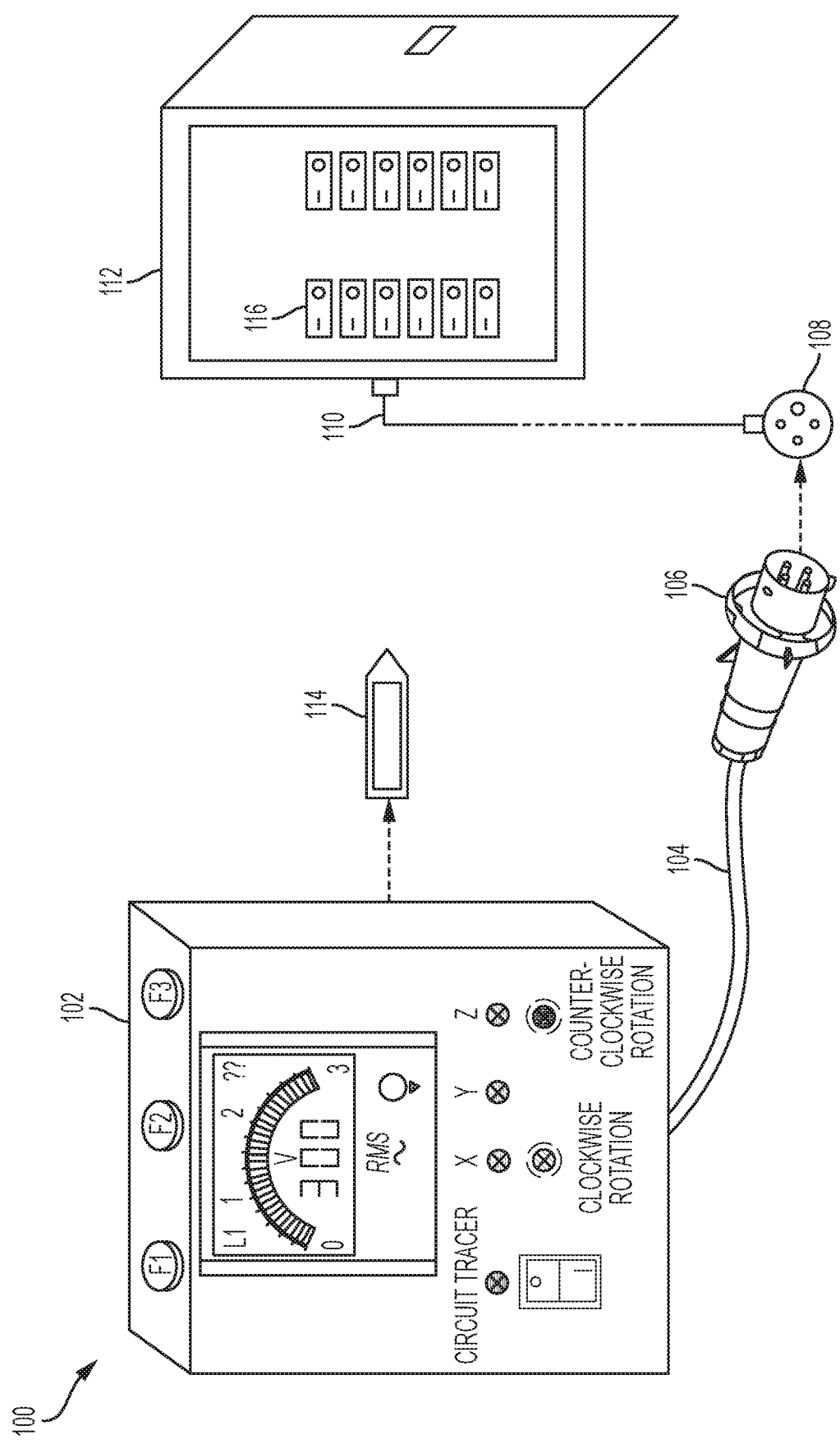
FIG. 1 is a contextual view of an example of a power-testing environment including a circuit multi-tester according to one aspect of the present disclosure.

Certain aspects and features relate to a circuit multi-tester including phase rotation-measurement circuitry. The circuit multi-tester can measure electrical characteristics including phase rotation, voltage level, and circuit breaker location corresponding to a power receptacle. The circuit multi-tester can include a plug that can couple to the receptacle to allow measurement of electrical characteristics without subjecting a technician to exposed power lines. Upon inserting the plug into a live receptacle to be analyzed, the circuit multi-tester can provide a visual indication of the phase rotation orientation of the power source supplying power to the receptacle. A visual indication that each line of the receptacle is being applied with power can also be provided. A mechanism on the circuit multi-tester can be toggled to measure and display a voltage value between each line. Additionally, using circuit tracer functionality, the circuit multi-tester can indicate a power source location including a location of a connection at a breaker box. Based on the electrical characteristics of the receptacle measured safely using the circuit multi-tester, a technician can diagnose power circuit errors or install electrical system confidently.

Determining phase rotation of a receptacle corresponding to a power source can be crucial in installation and diagnostic environments. Some electronic devices may not be designed to process both clockwise and counter-clockwise phase rotations. For example, a motor being applied with an alternating current ("AC") voltage in a clockwise phase rotation orientation turns in one direction. If the same motor is applied with an AC voltage in a counter-clockwise phase rotation orientation, the motor will turn in the opposite direction. Applying an incorrect or unanticipated phase rotation orientation to an electronic device can cause the device to operate incorrectly, which may cause damage to subsequently operated devices within a system, or can cause irreparable damage to the electronic device itself. Because phase rotation of power sources is not standardized throughout industries, determining the phase rotation of a power source can be vital to ensure that devices are installed properly and are not damaged when power is applied to the devices.

Determining voltage values between lines of a receptacle can be performed to ensure that each line has a correct voltage value and a correct voltage differential between other lines. Applying a high voltage value to a system may cause significant damage if that system is not designed for such high voltages. For example, a system intended to operate using a 240 volts AC ("VAC") power source connected through a receptacle may be installed incorrectly using a 480 VAC power source. While the system in this example can operate at a threshold below and above 240 VAC, 480 VAC can likely cause damage to the system (e.g., blown fuse or capacitive components, damage to circuit board(s), hazardous short or open circuits, etc.) that can require replacing power conversion circuitry, if possible, or the entire system.

Additionally, determining voltage differentials between lines can help determine if one or more lines have physically degradated or one or more lines is being supplied incorrectly with additional voltage, such that the voltage differential between two lines is an unanticipated value. By measuring voltage differential prior to installing a system or during diagnosis of a system failure, a technician can determine if a line may be indicative of future points of power failure despite the receptacle currently supplying adequate power. For example, a 208 VAC three-phase receptacle may have "hot" lines A, B, C, Neutral ("N"), and Ground ("GND"). A technician can expect the following voltage differential measurements that represent the ideals of this power supply: A to B, B to C, and A to C=208V; A, B, or C to N=120V; A, B, or C to GND=120V; N to GND=a nominal value close to 0V (e.g., less than 2V). The power source may be designated a 95%-105% acceptable threshold level, meaning the hot lines of the receptacle should be within a voltage range of 197V to 218V. If the technician measures a value of 194V across A to B, 207V across B to C, and 193V across A to C, there may be an issue with line A, or an issue with any other component between the receptacle and power source that the technician can then diagnose and correct.

As a further example using the 208 VAC three-phase receptacle, it can be important to measure the N-to-GND differential. If the measured voltage from N to GND is 0V, then N may have been connected to GND at the receptacle. A direct N-to-GND connection may be undesirable in certain circumstances depending on the load system, and detection of such a configuration can allow a technician to correct any defects.

In addition to phase rotation and voltage measurements, system installations or diagnostics can also involve determining the location of a circuit breaker corresponding to a specific receptacle. For example, an environment with multiple server devices can have multiple circuit breaker boxes. Each circuit breaker box can have multiple power connections each having respective circuit breakers, where each power connection or set of power connections can supply a server device. When performing an installation of a new server device, a circuit tracer device can be used to identify which circuit breaker connection(s) in a breaker box are supplying power to a specific receptacle. Incorrectly identifying which power connections correspond to the receptacle in question can cause a technician to incorrectly power off an operating server device. A circuit tracer device can accurately identify power lines in a circuit breaker box powering a specific receptacle.

A circuit multi-tester according to some examples can address one or more of the aforementioned issues relating to power measurement and testing as a single device. By implementing circuit tracer and voltage measurement functionality simultaneously with phase-rotation functionality, testing time can be reduced. For example, the circuit multi-tester can be plugged into an active receptacle, upon which phase rotation and voltage indicators can activate substantially immediately while the operating technician traces the circuit to a corresponding circuit breaker box or electrical panel.

In some examples, the circuit multi-tester can include a plug that can be inserted into a receptacle. The plug can create electrical connections between the power lines of the receptacle and the circuit multi-tester. The plug of the circuit multi-tester can enclose any receptacle wire or power contact so the technician or any other person in the testing environment is not at risk to come into direct contact with the receptacle power lines. The circuit multi-tester, including the plug, can reduce the risk of harm while also reducing the effort of the technician in measuring the various electrical characteristics of a power source through a receptacle.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure. FIG. 1 is a contextual view of a power-testing environment 100 including a circuit multi-tester 102 according to one example. The power-testing environment 100 can include a circuit multi-tester 102, a plug 106, a receptacle 108, a power cable 110, an electrical panel 112, and a circuit tracer receiver 114. The circuit multi-tester 102 can be a power-testing device that can measure power characteristics of power signals received from the receptacle 108. The circuit multi-tester 102 can include circuitry to perform phase rotation and voltage measurements, and circuit tracing functionality as described throughout the disclosure. In some examples, the circuit tracer receiver 114 can include a flashlight (not shown) to aid in viewing a specific circuit breaker in the electrical panel 112.

The circuit multi-tester 102 can be physically coupled to a cord 104 to establish an electrical connection to the plug 106. The plug 106 can include any number of conductive contacts, where each conductive contact can each be used to convey a power signal from a power source. Accordingly, the cord 104 can have at least as many wires or other conductive elements as the plug 106 has conductive contacts. For example, if the plug 106 is a plug designed to convey a three-phase three-line power signal, the plug 106 can have four metal contacts or pins—one each for three power lines and one for GND. The corresponding cord 104 can include at least four wires to be able to convey three power signals and provide a return path for GND. The cord 104 can be any desirable length, preferably a length that minimizes signal loss while maintaining the benefits of having an extended cable (e.g., 1 to 2 meters). In some examples, the cord 104 can be a 6 foot, 14 gauge +/− power cord that can be connected to any type of three-phase power plug ranging from 15 amps to 100 amps.

In some examples, the cord 104 can be affixed to the plug 106, such that the plug 106 has been spliced onto the cord 104 or otherwise permanently affixed to the cord 104. The plug 106 can be any form factor desirable for a specific testing environment. Thus, in some examples, the cord 104 can be terminated by a universal adapter that can be used to connect to a variety of plug types corresponding to different electrical connections. This can allow a single circuit multi-tester 102 to be used without having to splice the cord 104 repeatedly for different power applications requiring different connector types. For example, the adapter can connect to an application-specific plug for three-phase three-line power distribution. For use in another application, the three-phase three-line plug can be removed from the adapter, and another plug corresponding to another plug type, such as a three-phase four-line plug, can be attached. On one end, the application-specific plugs can each have a same interface that can connect to the adapter. On the other end, each application-specific plug can have a different interface that can connect to various types of receptacles. As further examples, the adapter can connect to a three-phase five-line plug with a neutral line, or a single-phase plug with any number of power lines.

The plug 106 can be physically coupled to the receptacle 108 to establish an electrical connection. The receptacle 108 can include metal contacts that can contact the metal contacts of the plug 106 so that the plug 106 can be electrically connected to the receptacle 108. Through this electrical connection, the receptacle 108 can transfer AC power to the plug 106 so that the circuit multi-tester 102 in electrical communication with the plug 106 is able to receive and measure power characteristics of the power signal(s). In some examples, the plug 106 can be a male connector and the receptacle 108 can be a female connector. In other examples, the plug 106 can be a female connector and the receptacle 108 can be a male connector. For example, as shown in FIG. 1, the plug 106 is depicted as a 460P9W male connector that can be inserted into the receptacle 108 that is depicted as a corresponding 460C9W female connector. Other types of male-to-female plugs and receptacles can be used depending on the testing environment involving various voltage and current values.

By using standardized plugs and receptacles to transfer power to the circuit multi-tester 102 to determine power characteristics, manual probing of the receptacle by a technician to determine phase rotation or voltage measurements can be avoided. The plug 106 and receptacle 108 combination can ensure that no electrical contact is exposed that may pose a danger to any person within the power-testing environment 100.

The power signal(s) provided by the receptacle 108 can be transferred via the power cable 110 from the electrical panel 112. The power cable 110 can include any number of wires to implement various power configurations (e.g., three-phase three-line power, three-phase four-line power, etc.). In some examples, the power cable 110 may not be easily traced from the receptacle 108 to the electrical panel 112. For example, the power cable 110 may be built into existing infrastructure, such that a technician is unable to follow the power cable 110, physically or directly, from the receptacle 108 to the electrical panel 112. To determine which electrical panel from a number of electrical panels the power cable 110 is connected to, the circuit tracer receiver 114 can be used.

After the circuit multi-tester 102 receives power from the receptacle 108, the circuit tracer receiver 114 can determine at least one circuit breaker 116 corresponding to a power line that is providing power to the circuit multi-tester 102. The circuit tracer receiver 114 can be in electrical communication with the circuit multi-tester 102. A technician can toggle a transponder via a switch on the circuit multi-tester 102 to enable circuit-tracing functionality. The technician can calibrate the circuit tracer receiver 114 away from power sources according to conventional circuit tracing methods. Once calibrated, the circuit tracer receiver 114 can enter an idle mode during which the circuit tracer receiver 114 can continually check for any active power signals. Thus, the technician can bring the circuit tracer receiver to the electrical panel 112 that is suspected or determined to be the source of power currently being measured by the circuit multi-tester 102. The circuit tracer receiver 114 can be swiped across a circuit breaker 116 and any other circuit breakers within the electrical panel 112 to determine which circuit breaker or circuit breakers are supplying power to the receptacle 108. The circuit tracer receiver 114 can produce an audible beeping noise corresponding to the signal strength, or proximity to the power lines powering the receptacle 108. For example, the circuit tracer receiver 114 can beep faster when approaching the circuit breaker that is powering the receptacle 108, and beep fastest when the circuit tracer receiver 114 is hovering adjacent to the circuit breaker that is powering the receptacle 108. In some examples, the circuit breaker receiver can be swiped across one or more circuit breakers consecutively, upon which the circuit tracer receiver 114 can beep again and indicate, via a green LED, that the currently measured circuit breaker corresponds to the measured power line.

By determining which circuit breaker or circuit breakers are connected to power lines that are actively providing power to the receptacle 108, a technician can toggle the circuit breakers to terminate power to the receptacle 108 so that systems can then be installed properly. Identification of the correct circuit breakers can also help a technician avoid improperly powering off other loads connected to the electrical panel 112.

Figure 2:
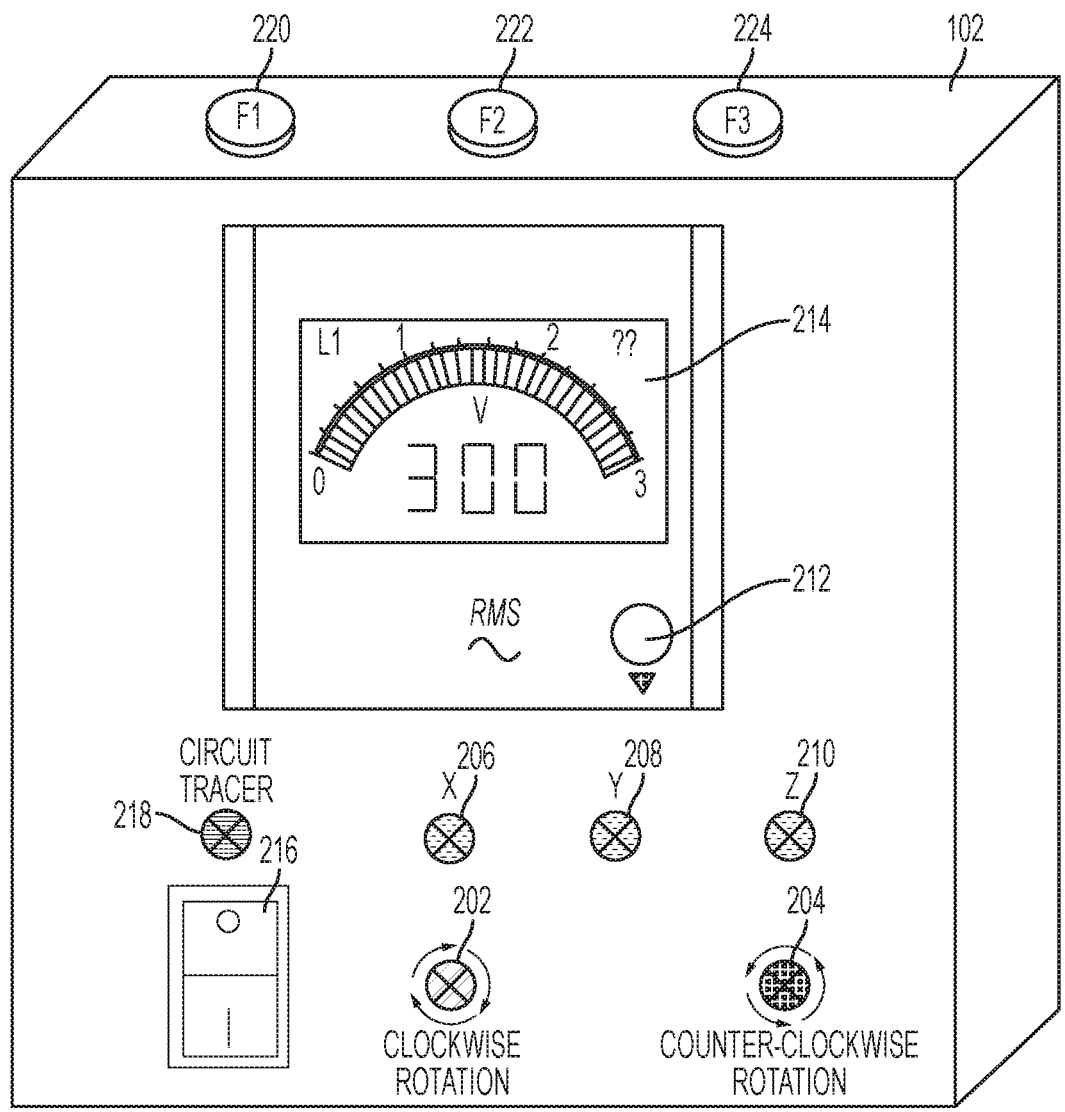
FIG. 2 is a perspective view of an example of a circuit multi-tester according to one aspect of the present disclosure.

FIG. 2 is a perspective view of the circuit multi-tester 102 according to one example. The circuit multi-tester 102 can include a variety of LEDs or other types of indicators to visually indicate the status of power lines and phase rotation corresponding to power received from a connected receptacle, in addition to power status of circuit tracer circuitry. The circuit multi-tester 102 can include an enclosure to house these indicator LEDs and circuitry for implementing phase rotation, voltage, and circuit tracer measurements.

When the circuit multi-tester 102 is plugged into an actively powered receptacle as previously described, the circuit multi-tester 102 can indicate if power is actively being applied to each power line connected to the receptacle. In a three-phase three-line example as depicted in FIG. 2, the circuit multi-tester 102 can include a LED 206 corresponding to a X line (e.g., "A" line), a LED 208 corresponding to a Y line (e.g., "B" line), and a LED 210 corresponding to a Z line (e.g., "C" line). The LEDs 206, 208, 210 can light up when being applied with power. If the circuit multi-tester 102 determines that one or more lines are not receiving power, the corresponding LEDs to those lines not receiving power can remain unlit. A power receptacle can be indicated as operating or wired properly when all three LEDs 206, 208, 210 are illuminated. In some examples, the LEDs 206, 208, 210 can light up after reaching a certain threshold voltage value. For example, if the circuit multi-tester 102 is measuring the Y line as 80V from a 208 VAC power receptacle, the LED 208 may not illuminate since the voltage is below a certain operating threshold value despite some voltage being present on the Y line. This can help a technician diagnose any potential power errors visually and quickly. The LEDs 206, 208, 210 can also provide an indication that the correct circuit breakers were turned on to subsequently provide power to the receptacle.

The circuit multi-tester 102 can include a LED 202 indicating a clockwise phase rotation and a LED 204 indicating a counterclockwise phase rotation. A clockwise phase rotation for a three-phase power source can be defined as when power signals are sequenced in an X-Y-Z (e.g., A-B-C) orientation. A counterclockwise phase rotation for a three-phase power source can be defined as when power signals are sequenced in an X-Z-Y (e.g., A-C-B) orientation. The LEDs 202, 204 can help a technician visually determine how the receptacle or power source were configured or design so that any load eventually attached to the receptacle can be configured properly to avoid damage.

The circuit multi-tester 102 can include a digital display 214 for displaying the voltage values as measured across different pairs of lines X, Y, Z, and GND. In some examples, the circuit multi-tester 102 can include a toggle mechanism to cycle through measuring and displaying the various voltage differentials between power lines of the receptacle. Using the button 212, the technician can select voltmeter readings by depressing the button 212 beside the digital display 214 to show voltage differentials for: X to GND; Y to GND; Z to GND; X to Y; Y to Z; and X to Z. In an example measuring power from four-line receptacle that includes a line for N, additional voltage differentials can be measured and displayed for: X to N; Y to N; Z to N; and N to GND. In some examples, the visual indicators represented by the LEDs 202, 204, 206, 208, 210, 218 can be displayed by the digital display 214. For example, the digital display 214 can indicate in a textual format that the phase rotation is a clockwise orientation and that one or more lines X, Y, and Z are not active. In some examples, the digital display 214 can indicate the lines corresponding to the displayed voltage measurement are actively being measured. The digital display 214 can include any other information pertinent to power measurements that could be contemplated by a practitioner of ordinary skill in the field of power testing. In some examples, the digital display can be a display such as a liquid crystal display or monochrome display.

The circuit multi-tester 102 can include a LED 218 corresponding to a power status of the circuit tracer functionality. When performing circuit tracing using a circuit tracer receiver, a technician can toggle switch 216 to supply power to circuit tracer circuitry. The LED 218 can illuminate when the switch 216 is toggled to indicate that the circuit tracer functionality is powered and enabled for use.

In some examples, the circuit multi-tester 102 can include fuses 220, 222, 224 in line with the X, Y, and Z lines between the circuit multi-tester 102 and the receptacle being measured. The fuses can provide a safety mechanism to protect the circuitry of the circuit multi-tester from being overloaded by a potential surge from the receptacle. For example, the fuses 220, 222, 224 can be 1 A fuses that create an open circuit upon X, Y, or Z line current exceeding 1 A, therefore preventing the receptacle to apply damaging current values to the circuit multi-tester 102.

Figure 3:
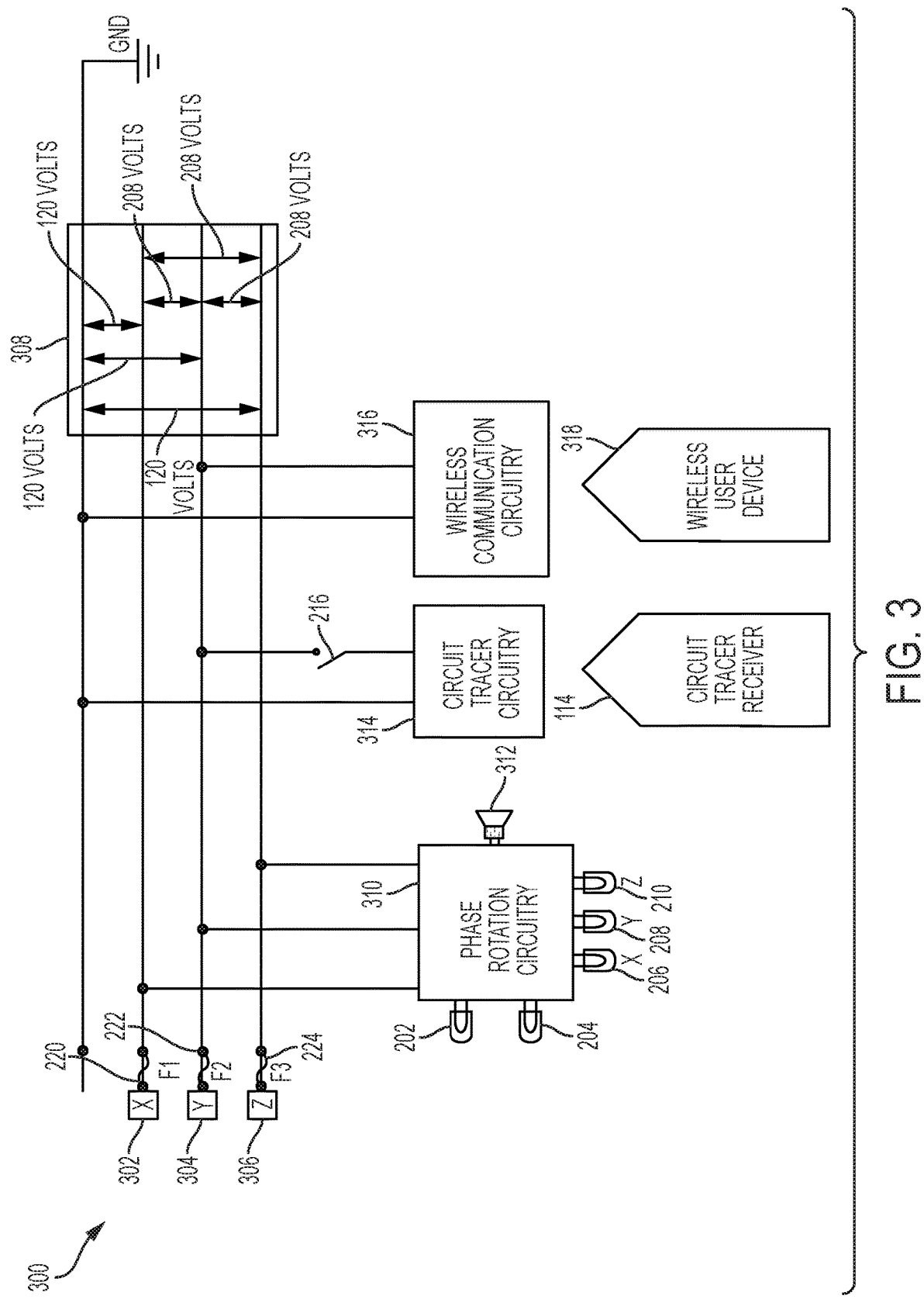
FIG. 3 is a schematic of an example of a circuit multi-tester according to one aspect of the present disclosure.

FIG. 3 is a schematic of the circuit multi-tester 102 according to one example. The circuit multi-tester 102 can include circuitry 300, comprising various components for determining power characteristics as previously described. The components depicted, apart from the circuit tracer receiver 114 and the wireless user device 320, can be housed by the enclosure of the circuit multi-tester 102 as described in FIG. 2.

The example of a circuit multi-tester circuit as shown in FIG. 3 is designed to be connected to a 208VAC three-phase three-line receptacle. The same principles described in FIG. 3 can be used to implement additional examples of circuit multi-testers that can be used for more complex power configurations at different or similar voltage values. For example, the circuit multi-tester can configured to be received into a three-phase four-line receptacle including N with voltage levels at 240V or 480V. In this example, the circuit multi-tester can include circuitry to transceive power on lines X, Y, Z, GND, and N, and can include a voltmeter to measure voltages between all lines. In some examples, the circuitry 300 can analyze receptacle power sources using different current values (e.g., 15 A to 100 A).

A X line 302, a Y line 304, and a Z line 306 can conduct power from the receptacle, where the lines 302, 304, 306 can be wires or electrical conductors within a cord as previously described. The circuitry 300 can include electrical connections to the lines 302, 304, 306 for measurement purposes and to power local components included in the circuitry 300. For example, a voltmeter display 308 (e.g., Altech Corp MV2307-110V-CU Panel Mount Meter) can be electrically connected to each line 302, 304, 306 such that voltage differentials across each line can be determined by the voltmeter display 308. In the example depicted, the voltmeter display 308 can be a six-point meter display that can measure the voltage differentials for a 208 VAC three-phase receptacle with lines X, Y, Z, and GND. Thus, when toggling through the displayed voltage differential, a technician can expect to see voltage measurements similar to the following: A to B, B to C, and A to C=208V; A, B, or C to GND=120V. In some examples, the circuitry 300 and corresponding voltmeter display 308 can include measuring an N line for a three-phase four-line receptacle. Thus, the voltmeter display 308 can be a ten-point meter display additionally providing voltage differential measurements for X to N, Y to N, Z to N, and N to GND.

The circuitry 300 can include phase rotation circuitry 310 (e.g., Tekpower Digital LED Phase Rotation Indicator, 20-400 Hz, SSP8030) to implement phase rotation functionality as described in the examples. The phase rotation circuitry 310 can operate the LEDs 202, 204, 206, 208, 210 to provide visual indicators for the status of the phase rotation orientation and whether the lines 302, 304, 306 are actively powered. In some examples, the phase rotation circuitry 310 can include or be affixed to a speaker 312. The speaker 312 can provide an audible indication of a change phase rotation or line power that may otherwise be represented by the LEDs 202, 204, 206, 208, 210. For example, the speaker 312 may produce a long beep to indicate that the lines 302, 304, 306 are actively being powered. As a further example, the speaker 312 may produce two consecutive beeps to indicate that one or more of the lines 302, 304, 306 are not actively being powered.

In some examples, the components of the circuitry 300 can be powered using voltage sourced from the X line 302, the Y line 304, or the Z line 306. As shown in FIG. 3, the circuit tracer circuitry 314 includes the switch 216 to toggle power from the Y line. Thus, when the circuitry 300 receives power from the Y line 304, the technician can toggle the switch 216 to supply power to the circuit tracer circuitry 314 for initiating circuit tracing operations using the circuit tracer receiver 114. In some examples, the circuit tracer circuitry 314 (e.g., Ideal circuit breaker finder Model #61-534) can be powered through a local power source enclosed within the circuit multi-tester, such as a battery. In some examples, the circuitry 300 can include a tristate switch in place of the switch 216 to allow a technician to choose between powering the circuit tracer circuitry using the power received from a receptacle or using the power from a local power source. The circuit tracer circuitry 314 can include a communication mechanism to communicate information to the circuit tracer receiver 114. For example, the circuit tracer circuitry 314 can include a transponder that is uniquely identifiable by the circuit tracer receiver 114.

In the example shown, the circuit tracer circuitry 314 is designed to indicate the Y phase of the three-phase breaker, as shown by the circuit tracer circuitry 314 connection to the Y line via the switch 216. In other examples, the circuit tracer circuitry 314 can be connected to the X or Z phases so the circuit tracer receiver 114 can detect the X or Z lines. In some examples, the circuit multi-tester 102 can toggle the power connection of the circuit tracer circuitry 314 to connect to the X line, Y line, or Z line via a multistate switch, such that a single circuit multi-tester 102 can locate the circuit breaker corresponding to each active power line.

The circuitry 300 can include wireless communication circuitry 316 that can communicate information relating to the power characteristics of the receptacle to a wireless user device 318. The wireless user device 318 can be a user device that may be portable, such as a smartphone, tablet, laptop, etc. The wireless communication circuitry 316 can include hardware and software for implementing a wireless communication protocol such as Bluetooth Low Energy ("BLE"). For example, the wireless communication circuitry can transmit phase rotation orientation and all voltage differential measurements, among other power-related measurements. In some examples, the wireless user device 318 can transmit command signals to the wireless communication circuitry 316. For example, a user may select, via an application on the wireless user device 318, to toggle the voltmeter display 308. The wireless communication circuitry 316 can receive this command and instruct the voltmeter display 308 to toggle the voltage differential currently being displayed to the next voltage differential value.

In some examples, the circuit multi-tester 102 can be any combination of the voltmeter display 308, the phase rotation circuitry 310, the circuit tracer circuitry 314, and the wireless communication circuitry 316 together with the plug as described in some examples.

Figure 4:
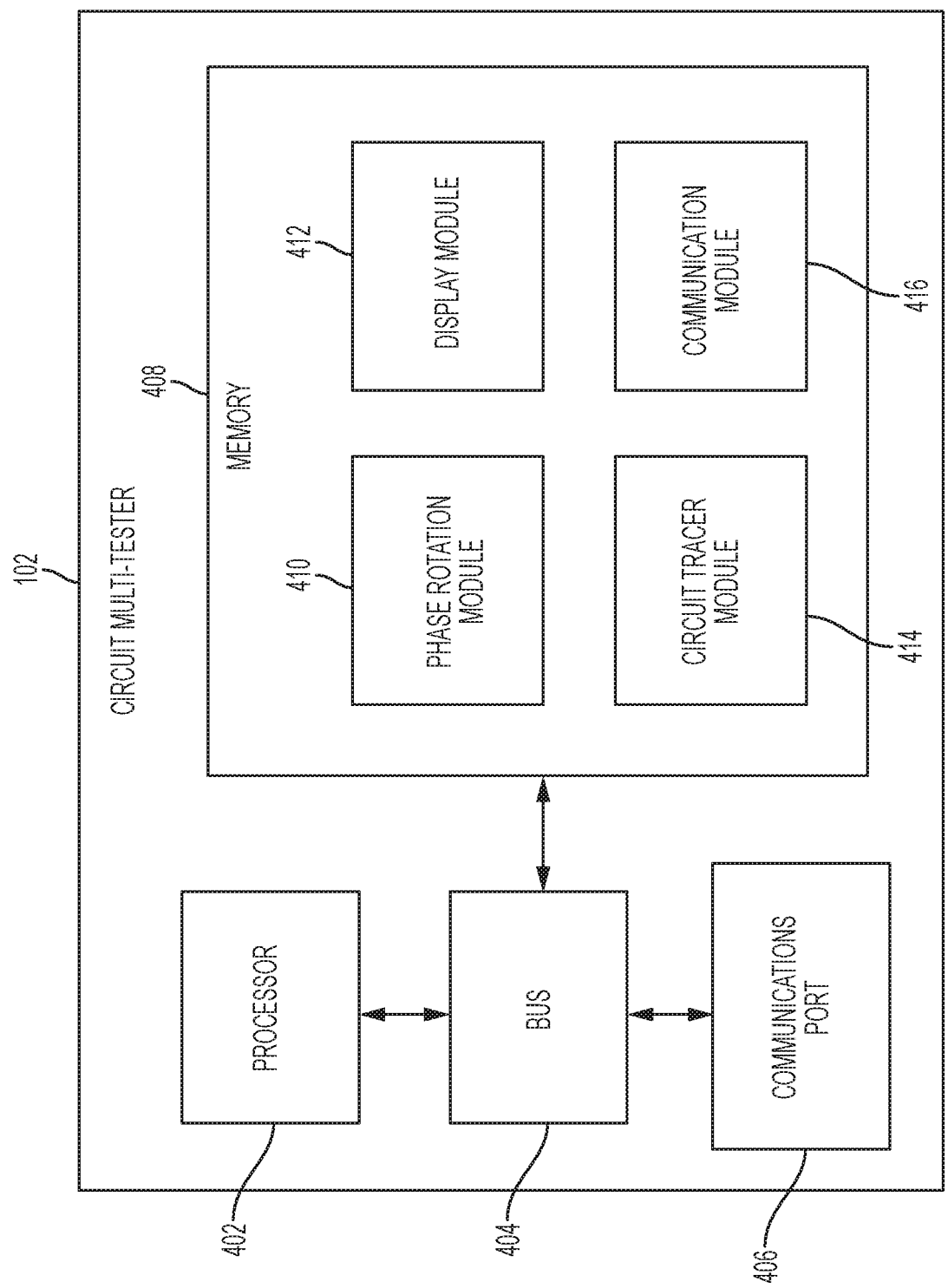
FIG. 4 is a block diagram of an example of a circuit multi-tester usable for executing program code to measure power characteristics according to one aspect of the present disclosure.

FIG. 4 is a block diagram of the circuit multi-tester 102 usable for executing program code to measure power characteristics according to one example. In some examples, the components depicted in FIG. 4 can be implemented together with the circuitry and devices described in FIG. 3 including the voltmeter display 308, the phase rotation circuitry 310, the circuit tracer circuitry 314, and the wireless communication circuitry 316. For example, the voltmeter display 308, the phase rotation circuitry 310, the circuit tracer circuitry 314, and the wireless communication circuitry 316 can each have their own processor(s), bus(ses), communications port(s), and memory, but are in electrical communication with each other. In some examples, the functions of the voltmeter display 308, the phase rotation circuitry 310, the circuit tracer circuitry 314, and the wireless communication circuitry 316 can be implemented in a single circuit device as depicted in FIG. 4

The circuit multi-tester 102 can include a processor 402, a bus 404, a communications port 406, and a memory 408. In some examples, the components shown in FIG. 4 (e.g., the processor 402, the bus 404, the communications port 406, and the memory 408) can be integrated into a single structure. For example, the components can be within a single housing. In other examples, the components shown in FIG. 4 can be distributed (e.g., in separate housings) and in electrical communication with each other.

The processor 402 can execute one or more operations for implementing some examples. The processor 402 can execute instructions stored in the memory 408 to perform the operations. The processor 402 can include one processing device or multiple processing devices. Non-limiting examples of the processor 402 include a Field-Programmable Gate Array ("FPGA"), an application-specific integrated circuit ("ASIC"), a microprocessor, etc.

The communication port 406 can transceive any data according to the examples. For example, the communications port can perform functions for transceiving information to the circuit tracer receiver and transceiving information with the wireless user device.

The processor 402 can be communicatively coupled to the memory 408 via the bus 404. The non-volatile memory 408 may include any type of memory device that retains stored information when powered off. Non-limiting examples of the memory 408 include electrically erasable and programmable read-only memory ("EEPROM"), flash memory, or any other type of non-volatile memory. In some examples, at least some of the memory 408 can include a medium from which the processor 402 can read instructions. A computer-readable medium can include electronic, optical, magnetic, or other storage devices capable of providing the processor 402 with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

The memory 408 can include program code for a phase rotation module 410, a display module 412, a circuit tracer module 414, and a communication module 416. The phase rotation module 410 can perform any functions related to measuring and indicating a phase rotation orientation of a receptacle as described in examples. The display module 412 can allow for measurement and display of all voltage differentials. The circuit tracer module 414 can implement circuit tracer operations for determining the power source of a receptacle. The communication module 416 can perform all functions related to communicating any information to or from a wireless user device.

Figure 5:
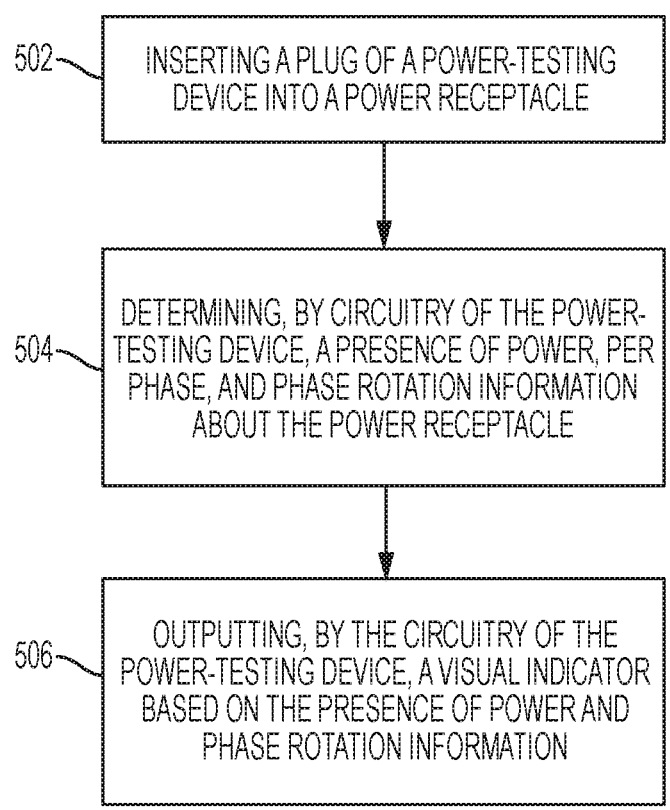
FIG. 5 is a flowchart of a process for measuring power characteristics using a circuit multi-tester according to one aspect of the present disclosure.

FIG. 5 is a flowchart of a process for measuring power characteristics using a circuit multi-tester according to one example. Some processes for measuring power characteristics using a circuit multi-tester can be described according to previous examples.

In block 502, a plug of a power-testing device is inserted into a power receptacle. The plug can be any type of plug to be inserted into a corresponding receptacle. For instance, the plug can be a male plug and the receptacle can be a female receptacle corresponding to and compatible with the plug type. Inserting the plug into the receptacle can establish electrical communications with a power source applying power to the receptacle and a power-testing device connected to the plug. This can allow the power-testing device to measure phase rotation and power information as described in block 504.

In block 504, a presence of power, per phase, and phase rotation information about the power receptacle is determined by circuitry of the power-testing device. A presence of power per phase can be determined, such that a line in a set of power lines corresponding to a multiphase power source can be measured individually. The power-testing device can determine if there exists any or a substantial presence of electrical power within each power line. Additionally, the power present per phase can be measured in terms of a voltage value, which can be displayed via the power-testing device. The circuitry of the power-testing device can also determine phase rotation information, such that the lines of a multiphase power source can be determined to be in a clockwise or counterclockwise orientation.

In some examples, other power information about the power receptacle including voltage information can be determined by the circuit multi-tester. For example, once connected to a receptacle, the circuit multi-tester can measure the voltage levels corresponding to each phase. Voltage information can be measured between each line X, Y, Z, N, and GND where applicable.

In block 506, a visual indicator based on the presence of power and phase rotation information is output by the circuitry of the power-testing device. Based on the presence of power and the phase rotation information determined in block 504, the circuitry of the power-testing device can output a visual indicator. The visual indicator can indicate to a technician for diagnostic, testing, or device installation purposes, a phase rotation of the receptacle power and whether power lines of the receptacle are energized. For example, the circuitry of the power-testing device can include a first set of LEDs and a second set of LEDs. The first set of LEDs can indicate whether the power receptacle supplies power for all phases. The second set of LEDs can indicate whether the phase rotation is clockwise or counterclockwise.

In some examples, the visual indicator of the presence of power and of phase rotation can include a first set of LEDs and a second set of LEDs. Each LED within the first set of LEDs can indicate whether the power receptacle is supplying power for each phase. The second set of LEDs can indicate that the phase rotation is clockwise or that the phase rotation is counterclockwise.

The circuit multi-tester and corresponding plug can prevent, in response to the plug being received by the power receptacle, exposure to active power lines while outputting the visual indicator. When the plug is connected to an active power receptacle, the circuit multi-tester can receive power from the receptacle to perform power measurements. During this power measurement process, the active lines that the circuit multi-tester is measuring can be dangerous to contact. The plug can be used to fully encapsulate or otherwise isolate the active power lines to prevent the possibility of bodily or dangerous contact with the lines.

In some examples, the power and phase rotation information can be transmitted by the circuitry to a wireless user device operated by a user. For example, the circuit multi-tester can include circuitry capable of wireless communication, such as BLE, to transmit power, phase rotation, or other power information about the receptacle to a mobile device. The user can then view the power information using the mobile device.

At any time during or after the processes described in blocks 502, 504, 506, the circuit multi-tester can transmit, via the circuitry, power information to a circuit tracer device. The circuit tracer device can be used to determine a location of a power source corresponding to the power receptacle based on the power information. For example, the circuit multi-tester can be connected to a receptacle, and the circuit tracer device can be powered on, configured, and used to trace the line connected to the receptacle back to a power source or terminal such as a circuit breaker box.

In some examples, before or after performing the steps as described in blocks 502, 504, 506, the process can further include interchanging the plug with a second plug of a different type than the plug and using the second plug with a different type of power receptacle. For example, the plug can include an adapter which may connect to various types of receptacles of different voltage and current configurations with different form factors. Once a technician is finished testing the power of one receptacle, the plug can be interchanged to a second plug to use the circuit multi-tester with a different receptacle type to perform new power measurements.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A power-testing device comprising:
   a plug that is configured to be received into a power receptacle for testing; and
   an enclosure with circuitry for outputting a visual indicator of a presence of power, per phase, for the power receptacle and of phase rotation information about the power receptacle,
   wherein the circuitry is configured to transmit power information to a circuit tracer device for determining a location of a power source corresponding to the power receptacle, the circuit tracer device including a switch for toggling among at least three lines of a multiphase power line couplable to the power receptacle.

2. The power-testing device of claim 1, further comprising:
   a digital display configured to depict voltage measurement information corresponding to each phase as numbers.

3. The power-testing device of claim 1, wherein the plug is interchangeable with different types of plugs useable with different types of power receptacles.

4. The power-testing device of claim 1, wherein the circuitry is further configured to wirelessly communicate power and phase rotation information to a wireless user device of a user, and wherein the wireless user device is configured to enable the user to wirelessly and remotely control the power-testing device.

5. The power-testing device of claim 1, wherein the visual indicator of the presence of power and of phase rotation includes a first set of LEDs and a second set of LEDs, wherein each LED within the first set of LEDs is configured to indicate whether the power receptacle supplies power for each phase, and wherein the second set of LEDs is configured to indicate that the phase rotation is clockwise or that the phase rotation is counterclockwise.

6. The power-testing device of claim 1, further comprising a plurality of fuses to prevent damage to the power-testing device.

7. The power-testing device of claim 1, wherein the circuit tracer device includes a flashlight.

8. The power-testing device of claim 1, further comprising a tristate switch that is toggleable between a first state in which a battery supplies power to the power-testing device and a second state in which the power receptacle supplies the power to the power-testing device.

9. The power-testing device of claim 1, wherein the power-testing device is configured to measure a voltage differential between a neutral line and a ground line of the multi-phase power line.

10. The power-testing device of claim 1, wherein the circuitry is configured to generate an audible indication, via a speaker, of a change in phase rotation or line power.

11. A system comprising:
a plug that is configured to be received into a power receptacle for testing;
an enclosure with circuitry for outputting a visual indicator of a presence of power, per phase, for the power receptacle and of phase rotation information about the power receptacle;
a cord for electrically coupling the plug to the enclosure; and
a circuit tracer device communicatively couplable with the circuitry, wherein the circuit tracer device includes a switch for toggling among at least three lines of a multiphase power line couplable to the power receptacle to receive power information from the circuitry for determining a location of a power source corresponding to the power receptacle.

12. The system of claim 11, further comprising:
a digital display configured to depict voltage measurement information corresponding to each phase as numbers.

13. The system of claim 11, wherein the plug is interchangeable with different types of plugs that are useable with different types of power receptacles.

14. The system of claim 11, wherein the circuitry is configured to wirelessly communicate with a wireless user device for transmitting power and phase rotation information to a user, and wherein the wireless user device is configured to enable the user to wirelessly and remotely control the circuitry.

15. A method comprising:
inserting a plug of a power-testing device into a power receptacle;
determining, by circuitry of the power-testing device, a presence of power, per phase, and phase rotation information about the power receptacle;
outputting, by the circuitry of the power-testing device, a visual indicator based on the presence of power and phase rotation information;
transmitting, by the circuitry, power information to a circuit tracer device, wherein the circuit tracer device includes a switch for toggling among at least three lines of a multiphase power line coupled to the power receptacle; and
determining, by the circuit tracer device, a location of a power source corresponding to the power receptacle based on the power information.

16. The method of claim 15, further comprising:
displaying voltage measurement information corresponding to each phase on a digital display of the power-testing device.

17. The method of claim 15, further comprising:
interchanging the plug with a second plug of a different type than the plug and using the second plug with a different type of power receptacle.

18. The method of claim 15, further comprising:
receiving, by the circuitry, a command signal from a wireless user device operated by a user for toggling a voltmeter display of the power-testing device.

19. The method of claim 15, further comprising:
switching, by the circuit tracer device and in response to a toggling of the switch by a user, from being electrically coupled to a first line of the multiphase power line to being electrically coupled to a second line of the multiphase power line.

* * * * *